United States Patent
Underhill et al.

(10) Patent No.: US 9,588,184 B2
(45) Date of Patent: Mar. 7, 2017

(54) BATTERY STATE-OF-CHARGE AGGREGATION METHOD

(71) Applicant: Nuvera Fuel Cells, Inc., Billerica, MA (US)

(72) Inventors: Tyler Underhill, Waltham, MA (US); Pierre-Francois Quet, Cambridge, MA (US)

(73) Assignee: NUVERA FUEL CELLS, INC., Billerica, MA (US)

( * ) Notice: Subject to any disclaimer, the term of this patent is extended or adjusted under 35 U.S.C. 154(b) by 492 days.

(21) Appl. No.: 14/220,949

(22) Filed: Mar. 20, 2014

(65) Prior Publication Data
US 2014/0324370 A1 Oct. 30, 2014

Related U.S. Application Data

(60) Provisional application No. 61/817,610, filed on Apr. 30, 2013.

(51) Int. Cl.
| | | |
|---|---|---|
| *G01R 31/36* | (2006.01) | |
| *H01M 10/44* | (2006.01) | |
| *H01M 10/48* | (2006.01) | |
| *B60L 11/18* | (2006.01) | |
| *H01M 16/00* | (2006.01) | |

(52) U.S. Cl.
CPC ...... *G01R 31/3648* (2013.01); *B60L 11/1862* (2013.01); *G01R 31/3658* (2013.01); *H01M 16/006* (2013.01); *H01M 10/482* (2013.01); *H01M 10/486* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 8,635,037 B2 * | 1/2014 | Quet | ................ | H01M 8/04656 320/132 |
| 2010/0026243 A1 | 2/2010 | Tatsumi | | |

(Continued)

FOREIGN PATENT DOCUMENTS

| | | |
|---|---|---|
| WO | WO 2013/054672 | 4/2013 |

OTHER PUBLICATIONS

International Search Report and Written Opinion for International Application No. PCT/US2014/032975, dated Nov. 20, 2014, (12 pages).

*Primary Examiner* — Huan Tran
(74) *Attorney, Agent, or Firm* — Finnegan, Henderson, Farabow, Garrett & Dunner, LLP

(57) ABSTRACT

Embodiments of the disclosure may include a method of managing a state of charge of a battery having a plurality of battery cells. The method may include calculating an individual state of charge for each battery cell, calculating an average state of charge for the battery cells, defining a minimum and a maximum average state of charge threshold, and calculating an overall state of charge for the battery such that when the average state of charge is below the minimum threshold, the overall state of charge is calculated based on the state of charge of a subset of battery cells having the lowest state of charge, and when the average state of charge is above the maximum threshold, the overall state of charge is calculated based on the state of charge of a subset of battery cells having the highest state of charge.

20 Claims, 3 Drawing Sheets

(52) U.S. Cl.
CPC ...... *H01M 2220/20* (2013.01); *Y02T 10/7005* (2013.01); *Y02T 10/705* (2013.01); *Y02T 10/7044* (2013.01)

(56) References Cited

U.S. PATENT DOCUMENTS

2012/0022744 A1  1/2012  Endo
2014/0239900 A1  8/2014  Abe et al.

\* cited by examiner

BATTERY STATE-OF-CHARGE AGGREGATION METHOD

This patent application claims the benefit of priority under 35 U.S.C. §120 to U.S. Provisional Patent Application No. 61/817,610, filed Apr. 30, 2013, which is incorporated herein by reference in its entirety.

Embodiments of the present disclosure relate to battery cells, and more particularly, to a method of aggregating the state of charges of individual battery cells to calculate an overall battery state of charge.

Electric equipment powered by batteries, including vehicles, such as forklift trucks and golf carts, e.g., are frequently used in manufacturing, wholesale, and retail operations for transporting and/or lifting people and products. However, these electric vehicles may have shortcomings. For example, a forklift truck may require recharging every six to eight hours, requiring warehouse space for spare batteries and charging equipment. Moreover, the performance of the vehicle may be affected as the battery becomes depleted.

Electric vehicles powered by fuel cells may be refilled rather than recharged and thus may provide cost savings by eliminating the need to reserve valuable warehouse space for battery storage and charging equipment. Further, hybrid fuel cell systems may maintain their performance over the duration of a shift. The hybrid fuel cell systems described herein may achieve one or more of these benefits.

A hybrid fuel cell system used herein refers to a system comprising a fuel cell and a battery. The term "battery" used herein broadly refers to a device that can repeatedly store and dispense electric power, including, but not limited to, chemical batteries (e.g., a lead-acid battery, a lithium ion battery, a nickel-metal hydride battery, a nickel-cadmium battery) and ultra capacitors.

In a hybrid power system, a fuel cell may supply power to the motors and to the battery during normal operation. The battery may buffer electric demand, supplementing the fuel cell power at peak load and absorbing regenerative energy. For forklifts, for example, the state of charge ("SOC") of a battery may be managed so that the battery contains enough energy to meet the high electrical demand of traction and lift motors without being fully charged so it can accept regenerative energy when the vehicle undergoes regenerative events, such as braking or lowering a load. If the battery SOC is too high during regenerative events, the battery voltage may rise to an unsafe level that may damage the battery, the motors, or the motors' controllers, thereby causing system failures and shutdowns.

In accordance with one embodiment of the present disclosure, a method of managing a state of charge of a battery having a plurality of battery cells may include calculating an individual state of charge for each battery cell, calculating an average state of charge for the battery cells, defining a minimum and a maximum average state of charge threshold, and calculating an overall state of charge for the battery such that when the average state of charge is below the minimum threshold, the overall state of charge is calculated based on the state of charge of a subset of battery cells having the lowest state of charge, and when the average state of charge is above the maximum threshold, the overall state of charge is calculated based on the state of charge of a subset of battery cells having the highest state of charge.

Various embodiments of the disclosure may include one or more of the following aspects: the subset of battery cells having the lowest state of charge may include only the battery cell with the lowest state of charge and wherein the subset of battery cells having the highest state of charge may include only the battery cell with the highest state of charge; the number of battery cells used to calculate the overall state of charge may change over time as a function of the average state of charge of all of the battery cells at that time; the number of battery cells used to calculate the overall state of charge may be substantially equal to 1 when the average state of charge is below the minimum threshold or above the maximum threshold, and the number of cells used to calculate the overall state of charge may be substantially equal to the total number of battery cells when the average state of charge equals approximately 50%; the number of battery cells used to calculate the overall state of charge may change as a non-linear function when the average state of charge is between the maximum threshold and the minimum threshold; the number of battery cells used to calculate the overall state of charge may change as a linear function when the average state of charge is between approximately 50% and the maximum threshold and when the average state of charge is between approximately 50% and the minimum threshold; calculating the overall state of charge may include assigning a weight to the individual state of charge of each battery cell as a function of the average state of charge at that time and multiplying the individual state of charge of each battery cell by the assigned weight and the overall state of charge may be equal to the sum of the weighted individual state of charges; the minimum threshold may be an average state of charge of approximately 20% and the maximum threshold may be an average state of charge of approximately 80%; and the method may include defining at least one intermediate threshold.

In accordance with another embodiment, a method of managing a state of charge of a battery having a plurality of battery cells in a hybrid electric power system comprising a fuel cell may include: calculating a state of charge value for each battery cell, sorting the state of charge values for each battery cell in numerical order, calculating an average state of charge of all of the battery cells, defining a minimum and a maximum average state of charge threshold, and calculating an overall state of charge for the battery such that when the average state of charge falls below the minimum threshold, the overall state of charge equals the state of charge of the battery cell having the lowest state of charge relative to the other battery cells, and when the average state of charge is above the maximum threshold, the overall state of charge equals the state of charge of the battery cell having the highest state of charge relative to the other battery cells.

Various embodiments of the disclosure may include one or more of the following aspects: the overall state of charge may be calculated according to the following equation:

$$SOC_{overall} = \sum_{i=1}^{N} SOCs(i) * w(i).$$

wherein N is the total number of battery cells in the battery and w is a weight applied to the state of charge of an individual battery cell, which is a function of the average state of charge at a given time; the state of charge values may be sorted from highest to lowest; the weight applied to the individual battery cell state of charges may be calculated according to the following conditions: if the average state of charge is above or equal to 50%, then a weight 1/Ix is applied to a first subset [x] battery cells, a weight $$1 - \frac{[x]}{x}$$

is applied to a second subset [x]+1 battery cells, and a weight of 0 is applied to all remaining battery cells, and if the average state of charge is below 50%, then a 1/x is applied to a third subset [x] battery cells, a weigh $$1 - \frac{[x]}{x}$$

is applied to a battery cell defined as N−[x], and a weight of 0 is applied to the other cells, wherein x equals the number of battery cells used to calculate the overall state of charge; if $SOC_{avg} > SOC_{max}$ or $SOC_{avg} < SOC_{min}$, then x=1, if $50\% \leq SOC_{avg} \leq SOC_{max}$, then $$X = \frac{1-N}{SOC_{max} - 50}(SOC_{avg} - 50) + N,$$

and if $SOC_{min} \leq SOC_{avg}, < 50\%$, then $$X = \frac{1-N}{SOC_{min} - 50}(SOC_{avg} - 50) + N;$$

and the minimum threshold may be an average state of charge of approximately 20% and the maximum threshold may be an average state of charge of approximately 80%.

In accordance with another embodiment, a method of aggregating state of charge values for all cells of a battery to calculate an overall state of charge value for managing the state of charge of the battery may include: calculating the state of charge value for each cell in the battery, sorting the state of charge values for each cell in numerical order, calculating an average state of charge of all the cells in the battery, defining a minimum and a maximum average state of charge threshold, and calculating the overall state of charge for the battery such that when the average state of charge is below the minimum threshold, the overall state of charge equals the state of charge of the battery cell having the lowest state of charge and when the average state of charge is above the maximum threshold, the overall state of charge equals the state of charge of the battery cell having the highest state of charge.

Various embodiments of the disclosure may include one or more of the following aspects: the average state of charge and the overall state of charge may be approximately equal to each other when the average state of charge is approximately 50%; the minimum threshold may be an average state of charge of approximately 20% and the maximum threshold may be an average state of charge of approximately 80%; calculating the overall state of charge of the battery may substantially prevent the battery cell having the highest state of charge from being charged above a predetermined state and may substantially prevent the battery cell having the lowest state of charge from being discharged below a predetermined state; and the battery may be part of a hybrid electric power system including a fuel cell.

Additional objects and advantages of the embodiments will be set forth in part in the description that follows, and in part will be obvious from the description, or may be learned by practice of the embodiments. The objects and advantages of the embodiments will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the disclosure, and together with the description, serve to explain the principles of the disclosure.

Reference will now be made in detail to the exemplary embodiments of the present disclosure described below and illustrated in the accompanying drawings. Wherever possible, the same reference numbers will be used throughout the drawings to refer to same or like parts.

Figure 1:
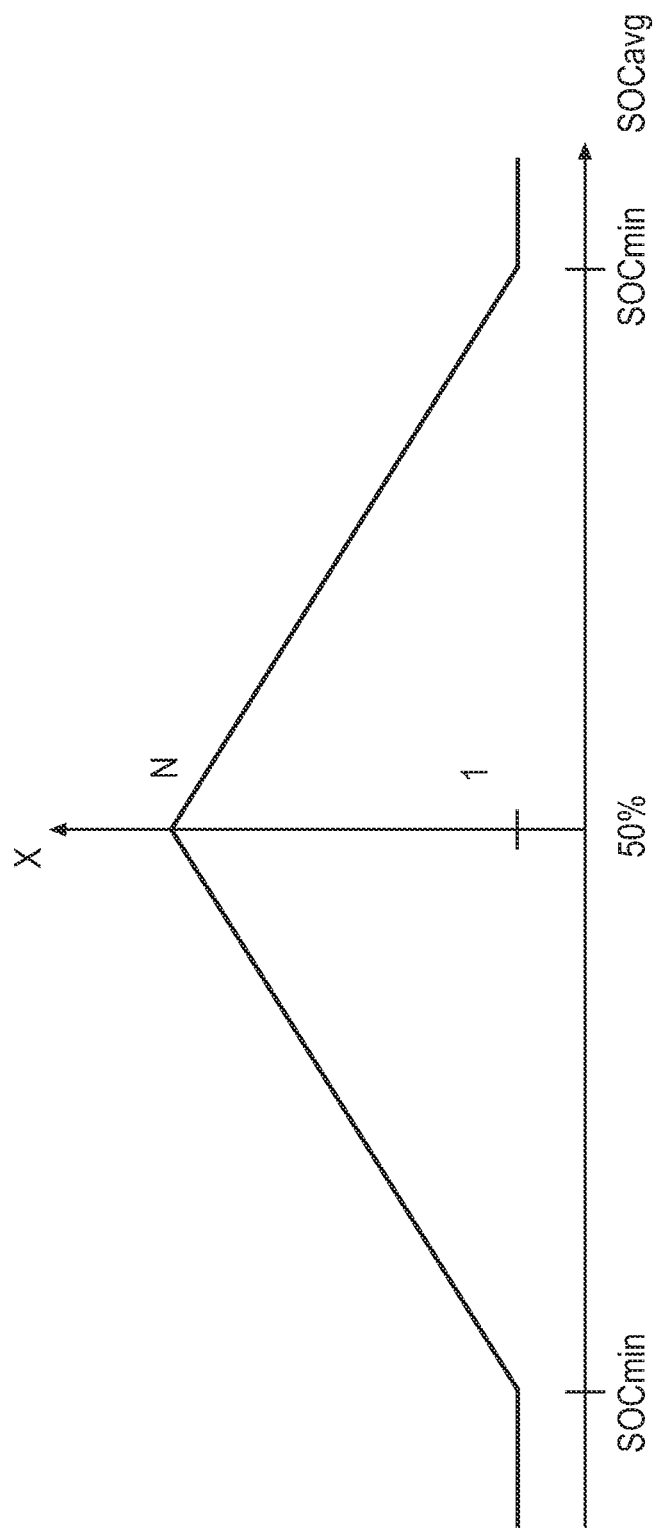
FIG. 1 illustrates a graphical depiction of a method of managing an overall battery state of charge, according to an embodiment of the present disclosure.

While the present disclosure is described herein with reference to illustrative embodiments for particular applications, such as hybrid fuel cell systems for use with hybrid vehicles, such as forklifts, it should be understood that the embodiments described herein are not limited thereto. Those having ordinary skill in the art and access to the teachings provided herein will recognize additional modifications, applications, embodiments, and substitution of equivalents that all fall within the scope of the disclosure. For example, the principles described herein may be used with any suitable hybrid fuel cell systems (e.g., for use with vehicles, including cars, buses, boats, and motorcycles, or for portable or emergency power systems). Accordingly, the disclosure is not to be considered as limited by the foregoing or following descriptions.

Other features and advantages and potential uses of the present disclosure will become apparent to someone skilled in the art from the following description and the accompanying drawings.

According to an embodiment of the present disclosure, the SOCs of individual battery cells may be aggregated and sorted to manage the SOC of a battery in a hybrid fuel cell system. In one embodiment, the SOCs of individual battery cells within a battery may be aggregated to determine an overall battery SOC value, which may be used to manage the battery SOC. In one embodiment, the overall SOC may be calculated as a function of the average SOC of the individual battery cells. For example, if the average SOC of all the battery cells is above a predetermined threshold value, the overall SOC may be calculated based on the SOCs of a subset of cells having the highest SOCs. This may reduce the risk of overcharging battery cells with the highest SOCs. In one embodiment, the subset of cells may include only the individual battery cell having the highest SOC. In some embodiments, a maximum threshold may be an average SOC of approximately 80%, though any suitable maximum threshold may be used, for example 70% or 90%.

If the average SOC of all the battery cells is below a predetermined threshold, the overall SOC may be calculated based on the SOCs of a subset of cells having the lowest SOCs. This may reduce the risk of over discharging the cells with the lowest SOC. In some embodiments, the overall SOC may be designed to equal the SOC of the lowest individual battery cell. In some embodiments, the minimum threshold may be an average SOC of approximately 20%, though any suitable minimum threshold may be used, for example, 30% or 10%.

Calculating an overall SOC in this manner may extend the life of the battery. The overall SOC calculation may provide greater protection for the battery cells having the highest and lowest SOCs, while making it easier to manage all of the SOCs. Further, the method may be configured to smoothly transition between the various conditions and thresholds.

To calculate an overall battery SOC value, the SOCs of each individual battery cell may be measured. The SOCs of individual battery cells may be measured using any suitable method, for example, via coulomb counting. The SOC values of each cell may then be sorted, for example, from highest to lowest or from lowest to highest SOC value. The cells may be sorted using a processor operably coupled to the battery cells or a local or remote processor included in the hybrid fuel cell system. Sorting the individual SOCs may allow for the creation of a vector of SOCs of dimension N, wherein N is equal to the total number of cells included in the battery. In some embodiments, the sorting step may be skipped, and, for example, a processor may simply record and not rank the SOCs of each cell. Next, the average SOC of all the battery cells may be calculated. The average SOC of all the cells may be defined as:

$$SOC_{avg} = \frac{\sum_{i=1}^{N} SOCs(i)}{N},$$

Once the average SOC value of the battery has been determined, the overall SOC may be calculated. While all of the battery cells N may be used to calculate the average SOC, the number of cells used to calculate the overall battery SOC may vary. In some embodiments, the number of cells used may vary as a function of the average SOC. A variable x may be defined to approximately correspond to the number of cells used to calculate the overall SOC of the battery. As the average SOC changes over time, variable x may change in response. In one embodiment, the method may be designed so that variable x is substantially equal to N when the average SOC is approximately equal to 50%. In such an embodiment, when the average SOC is approximately equal to 50%, all of the battery cells may be used to calculate the overall SOC, and the overall SOC may substantially equal the average SOC. The number of battery cells used to calculate overall SOC may change as the average SOC moves away from 50%. In some embodiments, variable x may be substantially equal to 1 when the average SOC is greater than or equal to a maximum threshold or is less than or equal to a minimum threshold. For example, only the cell with the highest or lowest SOC may be used to calculate the overall SOC if the average SOC is above or below a given threshold.

In some embodiments, variable x may change as a substantially linear function of the average SOC when the average SOC falls between a minimum SOC threshold and 50% and when the average SOC falls between a maximum SOC threshold and 50%. Such an embodiment may provide a smooth transition between the minimum threshold, maximum threshold, and intermediate states. A graphical representation of variable x in such an embodiment is included in FIG. 1. As FIG. 1 demonstrates, variable x may not always be an integer. Under such circumstances, the fractional part of x (the noninteger value) may correspond to a partial use of the SOC of a cell to calculate overall SOC. This is described in further detail below.

In other embodiments, variable x may change as a non-linear function when the average SOC falls between the minimum and maximum thresholds. For example, in some embodiments, variable x may change so that the overall SOC substantially equals the average SOC over a wider average SOC range, or so that the overall SOC transitions more or less gradually from the average SOC to the minimum and maximum thresholds. Further, in some embodiments, x may only include integers so that overall SOC changes in a step-wise fashion over time. In some embodiments, variable x may change as the average SOC falls below or rises above any number of intermediate thresholds. For example, a predetermined number of thresholds may be arranged so that as the average SOC changes and passes an intermediate threshold, variable x becomes smaller or larger. In some embodiments, x may never equal 1, and a subset of cells greater than 1 may be used to calculate overall SOC above a maximum threshold and/or below a minimum threshold. Further, in some embodiments, x may never equal the total number of battery cells N, and the overall SOC may always be calculated from a subset of battery cells.

To determine variable x and calculate overall SOC, once the SOCs of all the battery cells are sorted, each individual cell SOC may be associated with a weight w. In this embodiment, the SOCs may be sorted from the highest to the lowest value. As used herein, the symbol [x] denotes the floor function, which gives the largest integer less than or equal to x. Weight w may be a function of the average SOC of all the cells and the number of cells x used to calculate overall SOC, such that:

If the average SOC of all the cells is above or equal to 50%, then a weight 1/x is associated to the first [x] cells, a weight $$1 - \frac{[x]}{x}$$

is associated to the [x]+1 cell, and a weight of 0 is associated to the remaining cells.

If the average SOC of all the cells is below 50%, then a weight 1/x is associated to the last [x] cells, a weight $$1 - \frac{[x]}{x}$$

is associated to the N−[x] cell, and a weight of 0 is associated to the remaining cells.

The sum of the cells' weights may equal 1.

Once weighting has been determined and assigned, the individual SOCs may be multiplied by their corresponding weights, and the sum of these weighted SOCs may result in an overall SOC value. The overall SOC value may be defined as:

$$SOC_{overall} = \sum_{i=1}^{N} SOCs(i) * w(i).$$

In one embodiment, for example, individual SOCs may be aggregated according to the following method to achieve an overall SOC:

1) SOCs=vector of sorted values of individual battery cells' state of charges, from highest to lowest SOC values 2) 
$$SOC_{avg} = \frac{\sum_{i=1}^{N} SOCs(i)}{N}$$

3) If $SOC_{avg} > SOC_{max}$ or $SOC_{avg} < SOC_{min}$, then x=1

Elseif $50\% \leq SOC_{avg} \leq SOC_{max}$, then $x = \frac{1-N}{SOC_{max} - 50}(SOC_{avg} - 50) + N$ Elseif $SOC_{min} \leq SOC_{avg}, < 50\%$ then $x =$ $\frac{1-N}{SOC_{min} - 50}(SOC_{avg} - 50) + N$ 4) For i=1 to N,
   If $SOC_{avg} \geq 50\%$, then
     If i≤x, then w(i)=1/x Elseif $x < i < x+1$, then $w(i) = 1 - \frac{\lfloor x \rfloor}{x}$ Elseif i≥x+1, then w(i)=0
   Elseif $SOC_{avg} < 50\%$, then
     If i≥N−x+1, then w(i)=1/x Elseif $N - x < i < N - x + 1$, then $w(i) = 1 - \frac{\lfloor x \rfloor}{x}$ Elseif i≤N−x, then w(i)=0

5) $SOC_{overall} = \sum_{i=1}^{N} SOCs(i)*w(i)$.

Figure 2:
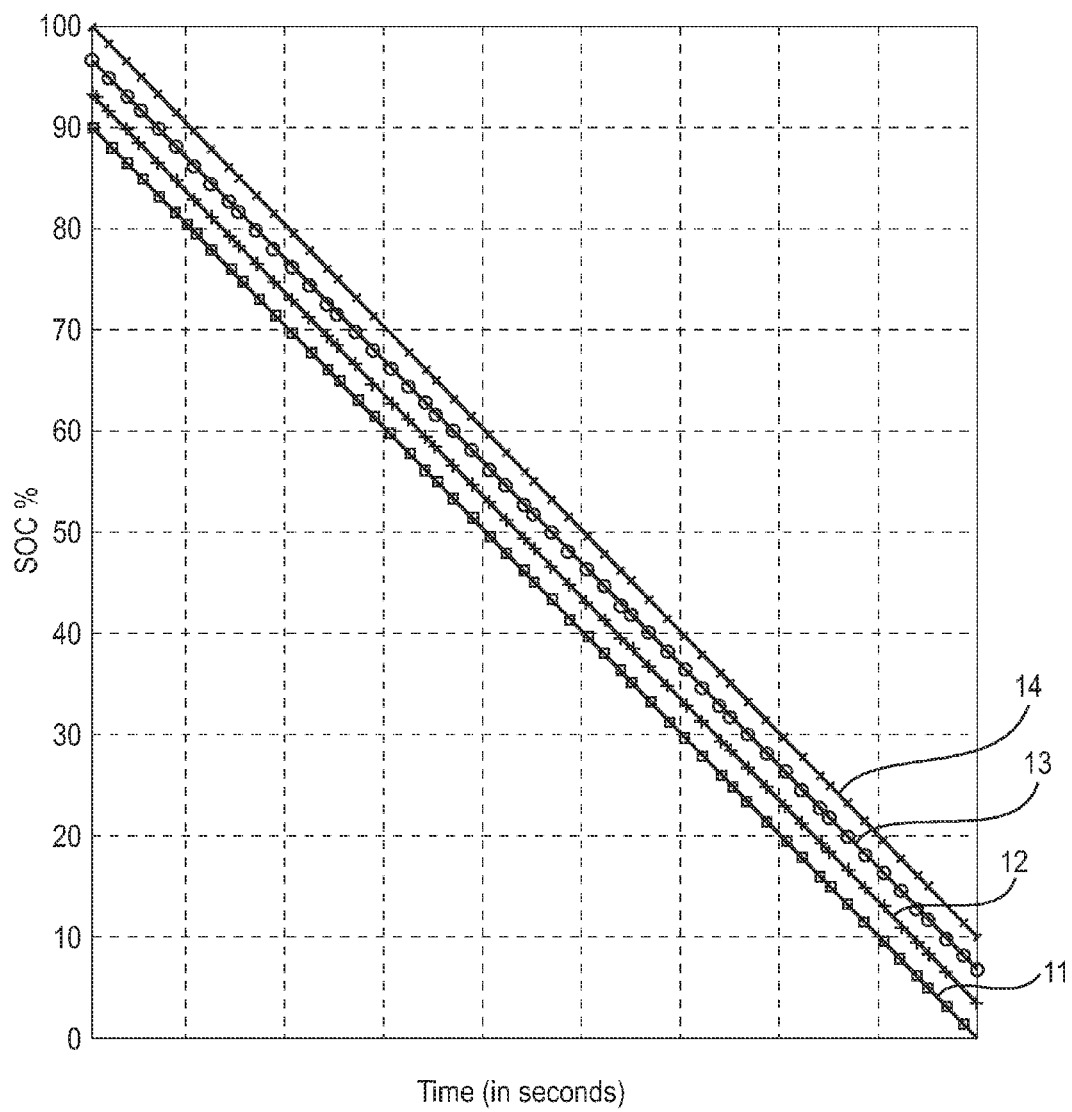
FIG. 2 illustrates a graphical depiction of individual battery cell states of charge over time.
Figure 3:
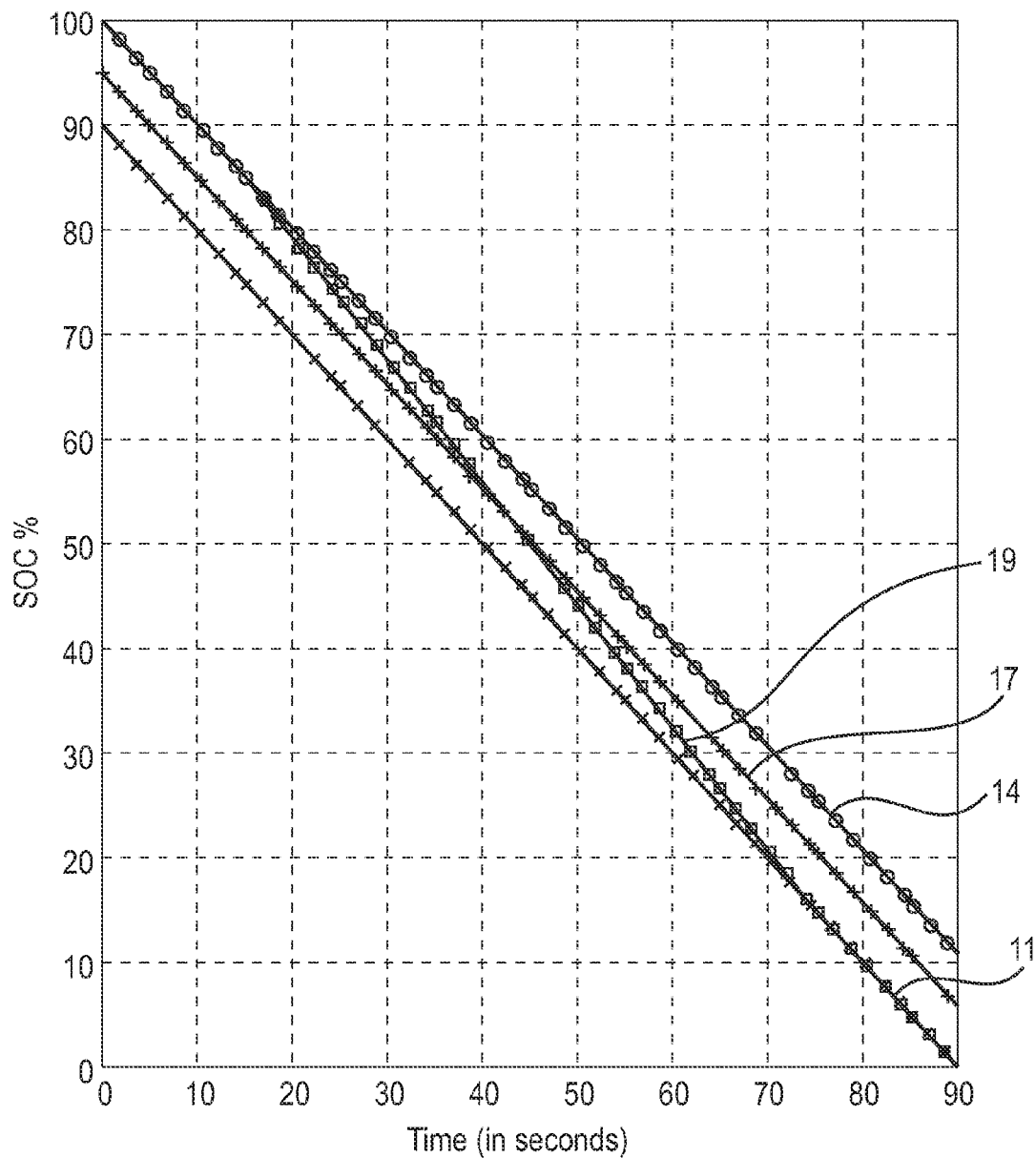
FIG. 3 illustrates a graphical depiction of a method of managing the overall battery state of charge for a battery containing the individual battery cells of FIG. 2, according to an embodiment of the present disclosure.

FIG. 2 and FIG. 3 together graphically depict the relationship between the SOCs of individual battery cells, average SOC, and overall SOC, according to one embodiment. FIG. 2 depicts the discharge of four exemplary individual battery cells over time. Lines 11, 12, 13, and 14 represent the SOCs of each individual battery cell, and the slope of each line shows the SOCs of each cell linearly decreasing with the passage of time. While FIG. 2 depicts a fuel cell battery having four cells (N=4), a battery including any suitable number of cells may be used.

FIG. 3 depicts a graphical representation of the SOC values over time of the battery cells with the minimum and maximum SOCs, represented by lines 11 and 14 from FIG. 2, respectively. Line 17 depicts the average SOC of the four battery cells depicted in FIG. 2. Line 19 depicts the overall SOC, which in this embodiment, is calculated in a linear fashion, as discussed in the exemplary embodiment above. In the embodiment of FIG. 3, a maximum average SOC threshold is set at 80%, and a minimum average SOC threshold is set at 20%. As is shown by line 19, the overall SOC above the 80% maximum threshold is equal to the SOC of only the cell with the highest SOC. Accordingly, above the 80% threshold, x=1. Likewise, the overall SOC below the 20% minimum threshold is equal to the SOC of only the cell with the lowest SOC. Accordingly, below the 20% threshold, x=1. Between the 20% and 80% thresholds, overall SOC may be calculated using the SOCs of a larger number of cells x, with x equaling N, and consequently, the overall SOC equaling the average SOC, at approximately 50% SOC. As is shown in FIG. 3, line 17 representing the average SOC and line 19 representing the overall SOC cross at approximately 50% average SOC. The overall SOC may be calculated in a linear manner to provide a smooth transition between the minimum, maximum, and intermediate discharge states.

In some embodiments, the transition between the maximum states and minimum states may be more abrupt and x may not change as a substantially linear function. In some embodiments, the lines denoting average SOC and overall SOC may substantially overlap for a longer period of time, or line 19 may change over time in a step-wise fashion, for example, if x is restricted to be an integer number. In other embodiments, the overall SOC above or below the 80% and 20% thresholds may be calculated to equal a subset of battery cells larger than one, and thus the slope of line 19 may never equal the slopes of the battery cells with the minimum SOC and the maximum SOC. Additionally, while each of the four battery cells are shown as discharging at a constant rate, the rate of change of SOC of each cell may vary over time, and the cells with the minimum and maximum SOC may vary as time passes.

Further, while the embodiment shown in FIG. 3 has symmetrical maximum and minimum thresholds (20% below the maximum SOC of 100% and 20% above the minimum SOC of 0%) of 80% and 20% are used, asymmetrical maximum and minimum thresholds, for example, 70% and 15% or 85% and 10%, may be used. Additionally, these thresholds may be constant throughout the life of a battery, or may be adjustable. In one embodiment, the SOC thresholds may be constant and may reflect the percentage capacity of the battery cells at a beginning point, e.g., 80% of a new battery cell, or the thresholds may be adjusted to compensate for the loss of charge capacity over the life of the cell, e.g., the threshold may be adjusted to reflect 80% SOC of a battery cell with a given age. In an adjustable embodiment, one or both of the thresholds may be programmed to automatically adjust over the life of the battery, or the thresholds may be manually adjustable at any time point.

In some embodiments, the thresholds themselves may be adjustable. For example, a minimum threshold may be adjusted from 15% to 20% average SOC. Such an adjustment may be used, for example, to account for the age of a battery cell or the intended use or output requirements of a battery cell. Again, such adjustable embodiments may be programmed to adjust one or both of the maximum and minimum thresholds over time, or the thresholds may be manually adjustable at any point in time.

While both minimum and maximum thresholds are depicted in the disclosed embodiments, it is contemplated that only a minimum or only a maximum threshold may be used in calculating overall SOC. Further, intermediate thresholds may be used in addition to minimum and/or maximum thresholds. For example, rather than changing in a linear fashion, the number of battery cells x used to calculate overall SOC may remain constant until another threshold is passed, at which point a smaller or larger subset of battery cells may be used to calculate overall SOC. Additionally, though the exemplary embodiments disclose the use of one cell to calculate the overall SOC above a maximum threshold and below a minimum threshold, a subset of cells including any number of cells less than the total number of battery cells N may be used.

Embodiments of the disclosure may use any suitable means of recording and processing data to calculate the average and overall SOC values. For example, sensors and/or measuring instruments may directly connect the battery to a processor located within the hybrid fuel cell battery, or sensors operably coupled to the battery may relay information, either through a hard connection or wirelessly, to a remote processor located at a distance from the battery.

Sensors in or around the battery, or operably coupled to the battery, may provide information regarding temperature, cell voltages, and/or currents, which may be converted into digital form. These inputs may be monitored and updated to provide information to a processor and may be used to calculate the SOCs of individual cells, the average SOC, the overall SOC, or another status of the battery, at any time. Additional information, such as ambient temperature and temperatures at various locations inside of or on the surface of the battery, may be monitored and may affect the computation of individual cell parameters. These inputs may be continuously monitored, or may be monitored at appropriate time intervals.

The many features and advantages of the present disclosure are apparent from the detailed specification, and thus, it is intended by the appended claims to cover all such features and advantages of the present disclosure that fall within the true spirit and scope of the present disclosure. Further, because numerous modifications and variations will readily occur to those skilled in the art, it is not desired to limit the present disclosure to the exact construction and operation illustrated and described, and accordingly, all suitable modifications and equivalents may be resorted to, falling within the scope of the present disclosure.

Moreover, those skilled in the art will appreciate that the conception upon which this disclosure is based may readily be used as a basis for designing other structures, methods, and systems for carrying out the several purposes of the present disclosure. Accordingly, the claims are not to be considered as limited by the foregoing description.

What is claimed is:

1. A method of managing a state of charge of a battery having a plurality of battery cells in a hybrid electric power system comprising a fuel cell, the method comprising:
    calculating an individual state of charge for each battery cell;
    calculating an average state of charge for the battery cells;
    defining a minimum average state of charge threshold;
    defining a maximum average state of charge threshold;
    calculating an overall state of charge for the battery such that when the average state of charge is below the minimum threshold, the overall state of charge is calculated based on the state of charge of a subset of battery cells having the lowest state of charge relative to the other battery cells, and when the average state of charge is above the maximum threshold, the overall state of charge is calculated based on the state of charge of a subset of battery cells having the highest state of charge relative to the other battery cells;
    preventing battery cell discharge if the average state of charge is below the minimum threshold and the overall state of charge is at or below a level at which the subset of battery cells having the lowest state of charge would overdischarge if discharged; and
    preventing battery cell charge if the average state of charge is above the maximum threshold and the overall state of charge is at or above a level at which the subset of battery cells having the highest state of charge would overcharge if charged.

2. The method according to claim 1, wherein the subset of battery cells having the lowest state of charge includes only the battery cell with the lowest state of charge and wherein the subset of battery cells having the highest state of charge includes only the battery cell with the highest state of charge.

3. The method according to claim 1, wherein the number of battery cells used to calculate the overall state of charge changes over time as a function of the average state of charge of all of the battery cells at that time.

4. The method according to claim 3, wherein the number of battery cells used to calculate the overall state of charge is substantially equal to 1 when the average state of charge is below the minimum threshold or above the maximum threshold, and the number of cells used to calculate the overall state of charge is substantially equal to the total number of battery cells when the average state of charge equals approximately 50%.

5. The method according to claim 3, wherein the number of battery cells used to calculate the overall state of charge changes as a non-linear function when the average state of charge is between the maximum threshold and the minimum threshold.

6. The method according to claim 4, wherein the number of battery cells used to calculate the overall state of charge changes as a linear function when the average state of charge is between approximately 50% and the maximum threshold and when the average state of charge is between approximately 50% and the minimum threshold.

7. The method according to claim 1, wherein calculating the overall state of charge includes assigning a weight to the individual state of charge of each battery cell as a function of the average state of charge at that time and multiplying the individual state of charge of each battery cell by the assigned weight and wherein the overall state of charge is equal to the sum of the weighted individual state of charges.

8. The method according to claim 1, wherein the minimum threshold is an average state of charge of approximately 20% and the maximum threshold is an average state of charge of approximately 80%.

9. The method according to claim 1 further comprising:
    defining at least one intermediate threshold.

10. A method of managing a state of charge of a battery having a plurality of battery cells in a hybrid electric power system comprising a fuel cell, the method comprising:
    calculating a state of charge value for each battery cell;
    sorting the state of charge values for each battery cell in numerical order;
    calculating an average state of charge of all of the battery cells;
    defining a minimum average state of charge threshold;
    defining a maximum average state of charge threshold;
    calculating an overall state of charge for the battery such that when the average state of charge falls below the minimum threshold, the overall state of charge equals the state of charge of the battery cell having the lowest state of charge relative to the other battery cells, and when the average state of charge is above the maximum threshold, the overall state of charge equals the state of charge of the battery cell having the highest state of charge relative to the other battery cells;
    preventing battery cell discharge if the average state of charge is below the minimum threshold and the overall state of charge is at a level at which the battery cell having the lowest state of charge relative to other battery cells would overdischarge if discharged; and preventing battery cell charge if the average state of charge is above the maximum threshold and the overall state of charge is at a level at which the battery cell having the highest state of charge relative to other battery cells would overcharge if charged.

11. The method according to claim 10, wherein the overall state of charge is calculated according to the following equation:

$$SOC_{overall} = \sum_{i=1}^{N} SOCs(i) * w(i).$$

wherein N is the total number of battery cells in the battery and w is a weight applied to the state of charge of an individual battery cell, which is a function of the average state of charge at a given time.

12. The method according to claim 11, wherein the state of charge values are sorted from highest to lowest.

13. The method according to claim 12, wherein the weight applied to the individual battery cell state of charges are calculated according to the following conditions:

if the average state of charge is above or equal to 50%, then a weight 1/x is applied to a first subset [x] battery cells, a weight $$1 - \frac{[x]}{x}$$

is applied to a second subset [x]+1 battery cells, and a weight of 0 is applied to all remaining battery cells; and if the average state of charge is below 50%, then a weight 1/x is applied to a third subset [x] battery cells, a weight $$1 - \frac{[x]}{x}$$

is applied to a battery cell defined as N−[x], and a weight of 0 is applied to the other cells, wherein x equals the number of battery cells used to calculate the overall state of charge and wherein [x] denotes a floor function, which gives the largest integer less than or equal to x.

14. The method according to claim 13, wherein x is calculated so that:

if $SOC_{avg} > SOC_{max}$ or $SOC_{avg} < SOC_{min}$, then $x = 1$;

if $50\% \leq SOC_{avg} \leq SOC_{max}$, then $x = \frac{1-N}{SOC_{max} - 50}(SOC_{avg} - 50) + N$;

and if $SOC_{min} \leq SOC_{avg}, < 50\%$, then $x = \frac{1-N}{SOC_{min} - 50}(SOC_{avg} - 50) + N$.

15. The method according to claim 10, wherein the minimum threshold is an average state of charge of approximately 20% and the maximum threshold is an average state of charge of approximately 80%.

16. A method of aggregating state of charge values for all cells of a battery to calculate an overall state of charge value for managing the state of charge of the battery, the method comprising:

calculating the state of charge value for each cell in the battery;

sorting the state of charge values for each cell in numerical order;

calculating an average state of charge of all the cells in the battery;

defining a minimum average state of charge threshold;

defining a maximum average state of charge threshold;

calculating the overall state of charge for the battery such that when the average state of charge is below the minimum threshold, the overall state of charge equals the state of charge of the battery cell having the lowest state of charge and when the average state of charge is above the maximum threshold, the overall state of charge equals the state of charge of the battery cell having the highest state of charge;

preventing battery cell discharge if the average state of charge is below the minimum threshold and the overall state of charge is at a level at which the battery cell having the lowest state of charge would overdischarge if discharged; and preventing battery cell charge if the average state of charge is above the maximum threshold and the overall state of charge is at a level at which the battery cell having the highest state of charge would overcharge if charged.

17. The method according to claim 16, wherein the average state of charge and the overall state of charge are approximately equal to each other when the average state of charge is approximately 50%.

18. The method according to claim 16, wherein the minimum threshold is an average state of charge of approximately 20% and the maximum threshold is an average state of charge of approximately 80%.

19. The method according to claim 16, wherein calculating the overall state of charge of the battery substantially prevents the battery cell having the highest state of charge from being charged above a predetermined state and substantially prevents the battery cell having the lowest state of charge from being discharged below a predetermined state.

20. The method according to claim 16, wherein the battery is part of a hybrid electric power system including a fuel cell.

* * * * *